United States Patent
De Arroyabe et al.

(10) Patent No.: US 9,923,184 B2
(45) Date of Patent: Mar. 20, 2018

(54) HIGH-VOLTAGE ENERGY STORAGE MODULE AND METHOD FOR PRODUCING THE HIGH-VOLTAGE ENERGY STORAGE MODULE

(71) Applicant: Bayerische Motoren Werke Aktiengesellschaft, Munich (DE)

(72) Inventors: Jose Lopez De Arroyabe, Munich (DE); Karl-Heinz Gaubatz, Parsdorf (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 204 days.

(21) Appl. No.: 14/835,940

(22) Filed: Aug. 26, 2015

(65) Prior Publication Data

US 2015/0364740 A1    Dec. 17, 2015

Related U.S. Application Data

(63) Continuation of application No. PCT/EP2014/050644, filed on Jan. 15, 2014.

(30) Foreign Application Priority Data

Feb. 27, 2013  (DE) .................. 10 2013 203 280

(51) Int. Cl.
*H01M 2/20* (2006.01)
*H01M 10/42* (2006.01)
(Continued)

(52) U.S. Cl.
CPC .......... *H01M 2/206* (2013.01); *B23K 20/004* (2013.01); *B23K 20/005* (2013.01); *B60L 1/02* (2013.01);
(Continued)

(58) Field of Classification Search
None
See application file for complete search history.

(56) References Cited

U.S. PATENT DOCUMENTS

| 7,923,144 B2 | 4/2011 | Kohn et al. |
| 2007/0187807 A1 | 8/2007 | Lee et al. |

(Continued)

FOREIGN PATENT DOCUMENTS

| CN | 101490871 A | 7/2009 |
| CN | 101617420 A | 12/2009 |

(Continued)

OTHER PUBLICATIONS

Chinese-language Office Action issued in counterpart Chinese Application No. 201480003522.5 dated Apr. 19, 2017 with English translation (six (6) pages).

(Continued)

*Primary Examiner* — Jonathan Crepeau
(74) *Attorney, Agent, or Firm* — Crowell & Moring LLP (57) ABSTRACT

A high-voltage energy storage module for supplying a voltage, in particular to a motor vehicle, includes at least two storage cells and at least one electrically conductive connection between two poles of different storage cells. The individual connection consists of multiple adjacently arranged bonding wires, and each bonding wire is secured to the two poles by means of a wire bonding.

20 Claims, 6 Drawing Sheets

(51) Int. Cl.
*B23K 20/00* (2006.01)
*H01M 10/48* (2006.01)
*B60L 1/02* (2006.01)
*B60L 3/00* (2006.01)
*B60L 11/18* (2006.01)
*H01L 23/00* (2006.01)
*H01M 2/24* (2006.01)
*B23K 101/38* (2006.01)
*H01L 23/367* (2006.01)

(52) U.S. Cl.
CPC ......... *B60L 3/0046* (2013.01); *B60L 11/1864* (2013.01); *B60L 11/1875* (2013.01); *B60L 11/1879* (2013.01); *H01L 24/49* (2013.01); *H01L 24/78* (2013.01); *H01M 2/24* (2013.01); *H01M 10/425* (2013.01); *H01M 10/482* (2013.01); *H01M 10/486* (2013.01); *B23K 2201/38* (2013.01); *B60L 2240/545* (2013.01); *B60L 2270/145* (2013.01); *H01L 23/3677* (2013.01); *H01L 24/45* (2013.01); *H01L 2224/45015* (2013.01); *H01L 2224/45124* (2013.01); *H01L 2224/45144* (2013.01); *H01L 2224/49* (2013.01); *H01L 2224/78* (2013.01); *H01L 2224/78301* (2013.01); *H01L 2924/181* (2013.01); *H01M 10/48* (2013.01); *H01M 2220/20* (2013.01); *Y02T 10/7005* (2013.01); *Y02T 10/7061* (2013.01)

(56) References Cited

U.S. PATENT DOCUMENTS

| | | |
|---|---|---|
| 2007/0188147 A1 | 8/2007 | Straubel et al. |
| 2007/0224513 A1 | 9/2007 | Kalynushkin et al. |
| 2008/0241667 A1 | 10/2008 | Kohn et al. |
| 2009/0325043 A1 | 12/2009 | Yoon et al. |
| 2010/0021809 A1 | 1/2010 | Froeschl et al. |
| 2010/0196749 A1 | 8/2010 | Yoshida et al. |
| 2012/0141852 A1 | 6/2012 | Eberhard et al. |
| 2013/0302651 A1* | 11/2013 | Kim ............... H05K 1/148 429/7 |
| 2015/0099152 A1* | 4/2015 | Bantel ............ H01M 2/206 429/121 |

FOREIGN PATENT DOCUMENTS

| | | |
|---|---|---|
| CN | 101933176 A | 12/2010 |
| DE | 198 10 746 A1 | 9/1999 |
| DE | 11 2007 000 352 T5 | 4/2009 |
| DE | 10 2011 015 622 A1 | 10/2012 |
| JP | 2010-97722 A | 4/2010 |
| JP | 2010-282811 A | 12/2010 |
| WO | WO 2008/121224 A1 | 10/2008 |
| WO | WO 2012/076125 A1 | 6/2012 |
| WO | WO 2013/160033 * | 10/2013 |

OTHER PUBLICATIONS

German Search Report dated Nov. 29, 2013 with partial English-language translation (ten (10) pages).

International Search Report (PCT/ISA/210) dated Mar. 24, 2014 with English-language translation (six (6) pages).

Chinese Office Action issued in counterpart Chinese Application No. 201480003522.5 dated Jul. 8, 2016 with English translation (nine pages).

* cited by examiner

HIGH-VOLTAGE ENERGY STORAGE MODULE AND METHOD FOR PRODUCING THE HIGH-VOLTAGE ENERGY STORAGE MODULE

CROSS REFERENCE TO RELATED APPLICATIONS

This application is a continuation of PCT International Application No. PCT/EP2014/050644, filed Jan. 15, 2014, which claims priority under 35 U.S.C. § 119 from German Patent Application No. 10 2013 203 280.3, filed Feb. 27, 2013, the entire disclosures of which are herein expressly incorporated by reference.

BACKGROUND AND SUMMARY OF THE INVENTION

The present invention relates to a high-voltage energy storage module for supplying voltage, in particular to a motor vehicle, and to a method for producing the high-voltage energy storage module.

High-voltage energy storage modules are used in vehicles for the sole or supplementary drive of the vehicle by an electric motor. In this context, a plurality of the high-voltage energy storage modules can be combined to form a battery. The individual high-voltage energy storage modules have a plurality of storage cells which are arranged in a row. Electrochemical elements, embodied, for example, as lithium-ion accumulators, are located in the individual storage cells. In the prior art, the individual poles of the storage cells in the high-voltage energy storage module are connected to one another by use of cables or rigid cell connectors.

An object of the present invention is to provide a high-voltage energy storage module which can be produced cost-effectively and in an automated process. In addition, the high-voltage energy storage module is to function in an operationally reliable fashion and with low maintenance. Furthermore, an object of the present invention is to provide a corresponding method for producing the high-voltage energy storage module.

This and other objects are achieved according to the invention by a high-voltage energy storage module for supplying voltage, in particular to a motor vehicle, comprising at least two storage cells and at least one electrically conductive connection between two poles of different storage cells. Electrochemical elements, preferably embodied as lithium-ion accumulators, are located in the storage cells. The storage cells preferably comprise a sealed housing in which the electrochemical elements are arranged. Two poles are formed on each storage cell. The poles are also referred to as connecting terminals. The poles of different storage cells are connected either in parallel or in series to one another by way of the electrically conductive connection. The invention provides that the individual connection is composed of a plurality of bonding wires arranged one next to the other. Each bonding wire is attached here to the two poles by a wire bonding. The wire bonding is a method for connecting a wire to a contact surface, for example to the pole of the storage cell. The wire bonding is also referred to as micro-welding. There is no need for any additional welding material or solder here. In order to produce the connection, part of the bonding wire is melted. This is done, for example, by applying ultrasonic vibrations to the bonding wire.

By using wire-bound bonding wires as an electrical connection between the individual poles it is possible to produce the high-voltage energy storage module in an automated fabrication process. This reduces the costs for the high-voltage energy storage module. At the same time, the bonding wires are relatively lightweight, with the result that a savings in weight can be achieved. The bonding wires conduct the main current, for example of an order of magnitude of 200 A. For this reason, a large number of bonding wires are correspondingly needed for one connection between two poles in order to make available overall a correspondingly large line cross section. The individual bonding wires are relatively thin and bendable, with the result that a flexible connection is produced which can compensate a certain length extension between the storage cells and is not susceptible to loads such as vibrations.

The high-voltage energy storage module preferably includes a circuit board having electronics for monitoring the storage cells. By means of the electronics, preferably comprising a CPU, the cell voltage and/or temperature of the individual storage cells can be monitored. The circuit board is preferably fitted onto the storage cells. By means of a corresponding embodiment of the circuit board, the circuit board can be used at the same time to center and/or to secure the individual storage cells with respect to one another. This allows for a savings in terms of additional components.

So that the electronics on the circuit board can monitor the temperature and/or the cell voltage of the individual storage cell, there is a need for an electrical connection to the circuit board in order to transmit a measuring current. Therefore, there is preferably provision that at least one of the bonding wires is attached between the two poles on the circuit board by way of wire bonding. The corresponding bonding wire therefore leads from one pole to the circuit board and from the circuit board to the next pole. In particular, the bonding wire on the circuit board is not interrupted, but merely connected by means of wire bonding.

Alternatively or additionally to the connecting of the bonding wire between the two poles, an additional bonding wire is preferably provided. The additional bonding wire is attached at one end to the pole and at the other end to the circuit board. The attachment to the pole and to the circuit board is in turn carried out by means of wire bonding.

The point at which the bonding wire or the additional bonding wire is electrically conductively connected to the circuit board is referred to as an attachment point. A temperature sensor is preferably arranged on the circuit board in the vicinity of the attachment point. The temperature sensor is designed to determine the temperature of the storage cell which is passed on via the bonding wire or the additional bonding wire. In order to determine the correct temperature of the storage cell, a corresponding calculation model is preferably implemented in the electronics on the circuit board. A phase shift between the measured temperature and the actual temperature at the storage cell can be taken into account by use of this calculation model.

The circuit board is of relatively thin design and preferably comprises a copper layer in the range from 10 to 100 μm. For the electrical connection of the entire high-voltage energy storage module there is therefore preferably a metal element positioned on the circuit board. This metal element is preferably an aluminum panel. A connecting device for a cable is provided on the metal element. The connecting device is preferably designed for the screwing on of a cable lug. Furthermore, an electrically conductive connection is provided between one of the poles and the metal element. This connection is composed again of a plurality of bonding wires arranged one next to the other. Each of these bonding wires is attached to the pole and to the metal element by way of wire bonding.

The bonding wires are dimensioned in such a way that they can be wire-bonded and readily bent into the required shape. For this purpose there is preferably a provision that the bonding wires have a round cross section with a diameter of a maximum of 1 mm, preferably a maximum of 750 µm, particularly preferably a maximum of 500 µm. As an alternative to this, the bonding wires are configured in a ribbon shape and preferably have a width of a maximum of 3 mm, particularly preferably a maximum of 2 mm. The bonding wires are advantageously produced from copper or gold, particularly preferably from aluminum.

The invention further comprises a method for producing the high-voltage energy storage module, comprising the following steps: (i) making available at least two storage cells, and (ii) forming at least one electrically conductive connection between two poles of different storage cells. A plurality of bonding wires are used in each case for the individual connections. The bonding wires are respectively wire-bonded to both poles.

In particular there is provision that during the wire bonding, the bonding wire is connected to the respective pole, to the metal element or to the circuit board by applying pressure, ultrasound and/or a raised temperature. The additional bonding wire is also correspondingly connected to the pole and the circuit board.

Preferably, no additional tool, such as, for example, a welding additive or a solder is used for the wire bonding. The bonding wire is melted and the conductive connection produced purely by applying ultrasound, pressure and/or temperature.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 5:
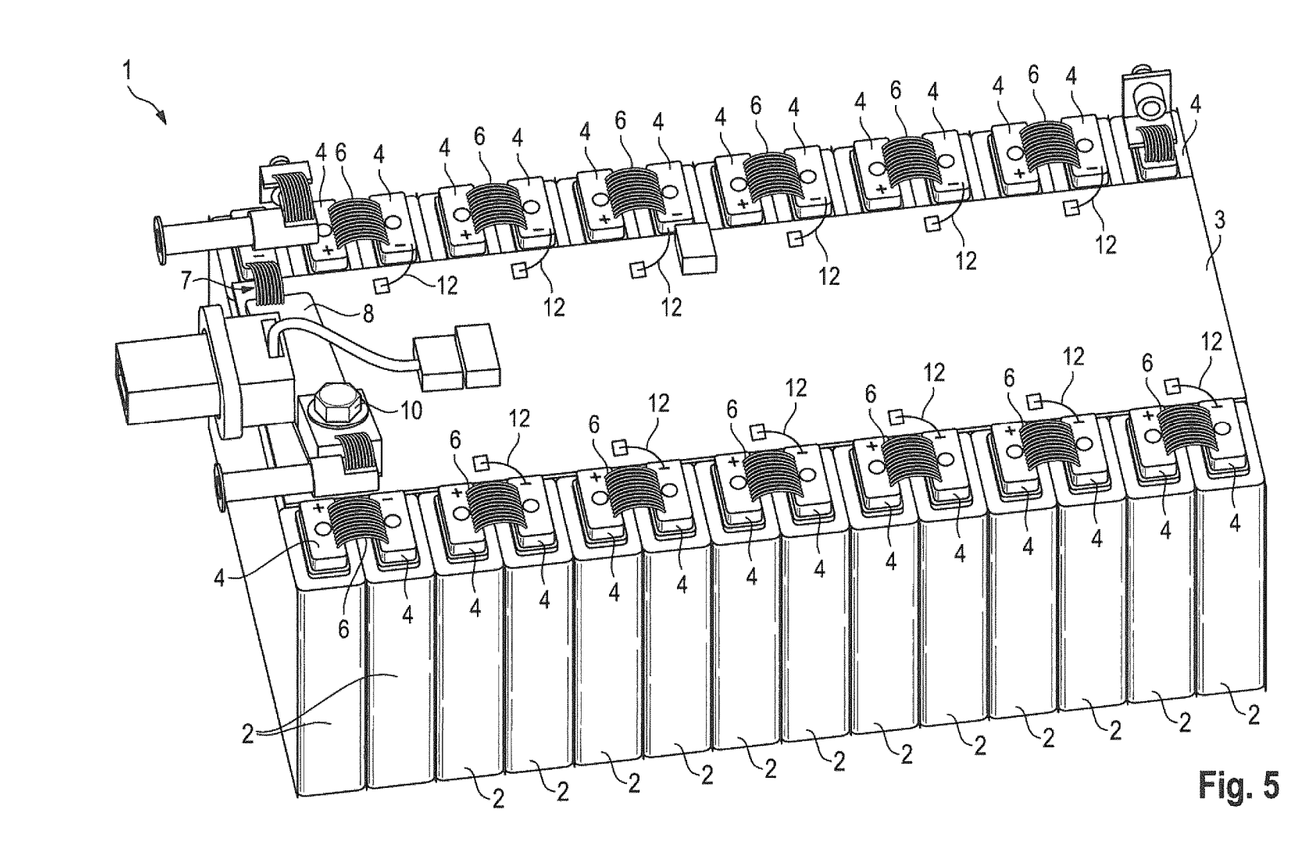
FIG. 5 is a perspective view of the high-voltage energy storage module according to the invention in accordance with a second exemplary embodiment.
Figure 6:
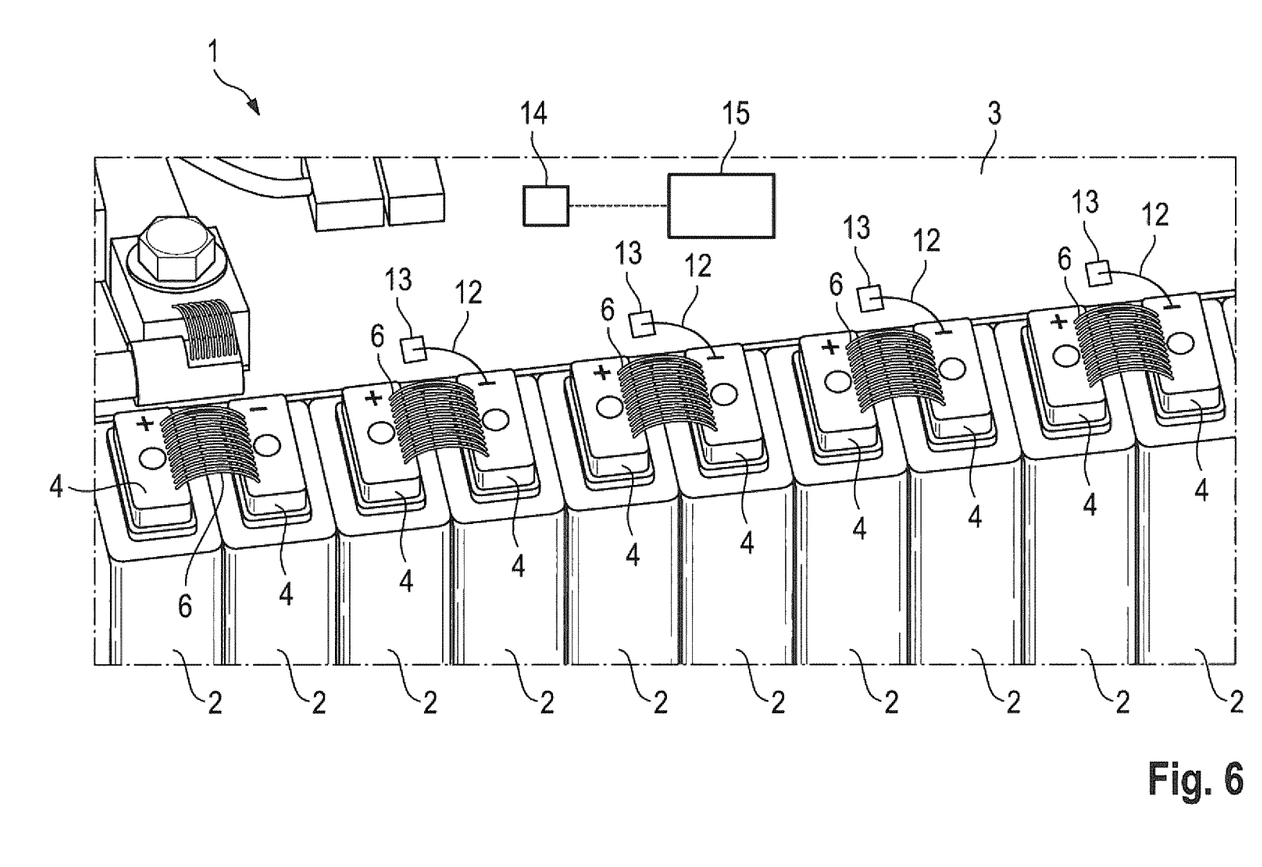
FIG. 6 is a perspective view of a detail of the high-voltage energy storage module according to the invention in accordance with the second exemplary embodiment.
Figure 7:
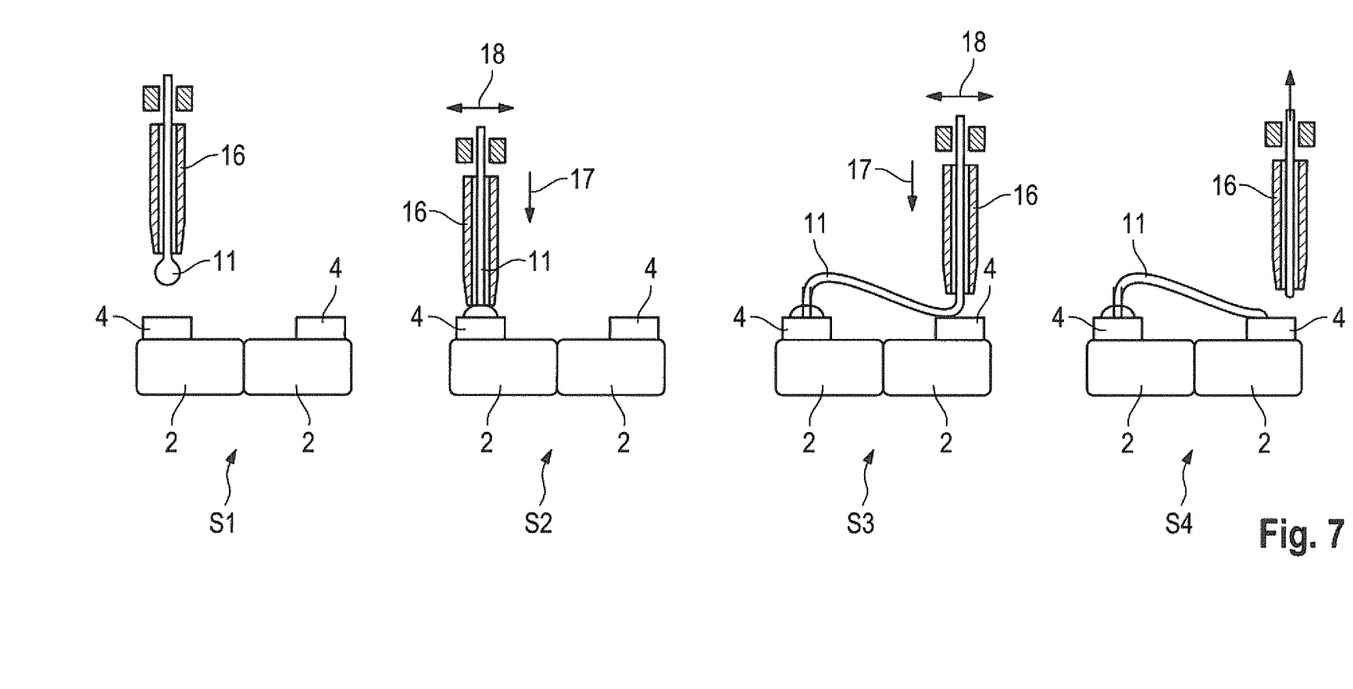
FIG. 7 illustrates production steps for the high-voltage energy storage module of the two exemplary embodiments.

A first exemplary embodiment of the high-voltage energy storage module 1 is described below with reference to FIGS. 1 to 4. FIGS. 5 and 6 show a second exemplary embodiment of the high-voltage energy storage module 1. FIG. 7 shows method steps for producing the high-voltage energy storage module 1 of the two exemplary embodiments. Identical or functionally identical components are provided with the same reference symbols in all the exemplary embodiments.

Figure 1:
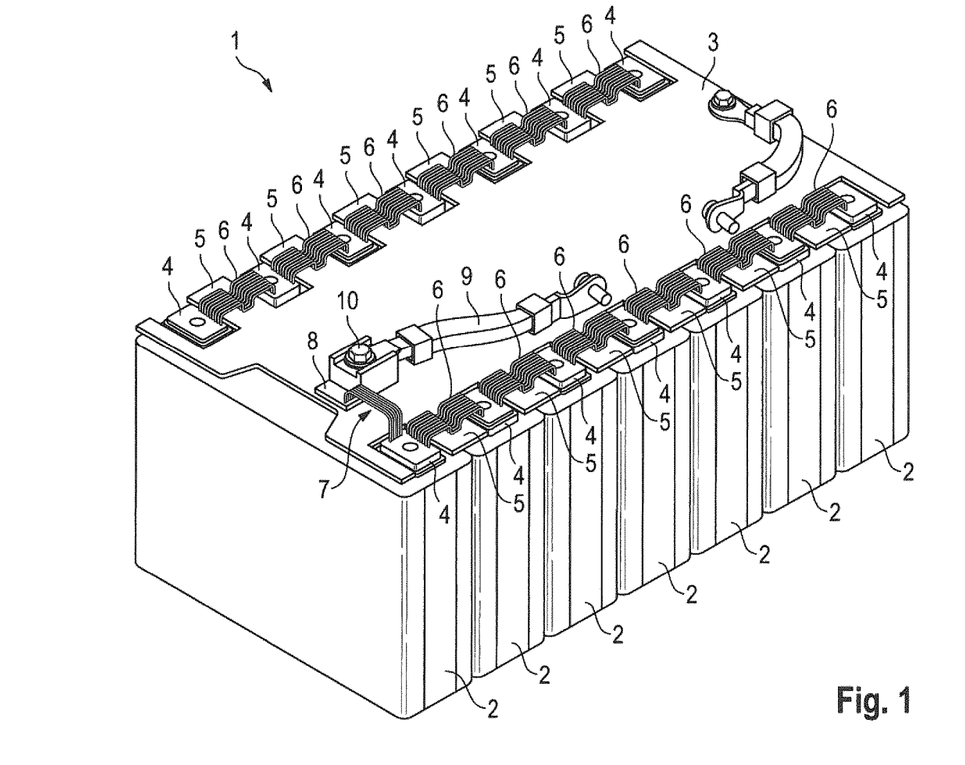
FIG. 1 is a perspective view of a high-voltage energy storage module according to the invention in accordance with a first exemplary embodiment.
Figure 2:
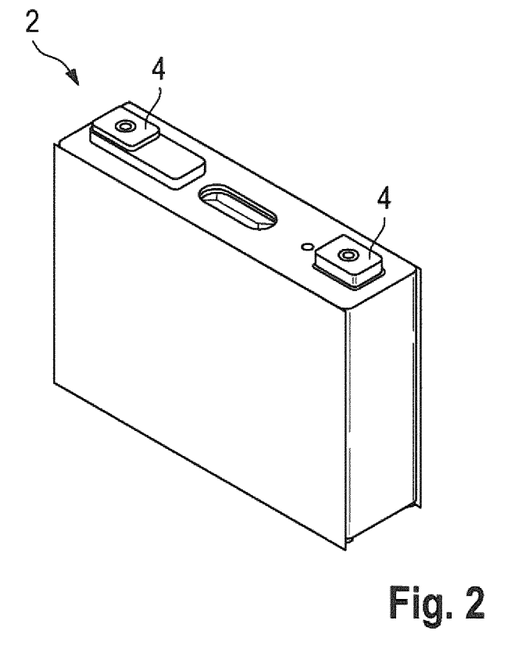
FIG. 2 is a perspective view of a storage cell of the high-voltage energy storage module according to the invention in accordance with the first exemplary embodiment.

According to FIG. 1, the high-voltage energy storage module 1 includes a plurality of storage cells 2. FIG. 2 shows one of the storage cells 2 in detail. The storage cells 2 are of prismatic design and arranged in a row in the high-voltage energy storage module 1. Each storage cell 2 has two poles 4. The storage cells 2 are arranged in a row such that all the poles 4 point to one side. A circuit board 3 is fitted onto this side of the high-voltage energy storage module 1.

The circuit board 3 has a plurality of clips 5 in the first exemplary embodiment. A clip 5 projects in each case between two adjacent poles 4 of different storage cells 2. The circuit board 3 is configured or embodied in such a way that it positions and secures the storage cells 2 with respect to one another.

A connection 6 is arranged in each case between two adjacent poles 4 of different storage cells 2. The connection 6 is electrically conductive and connects the different storage cells 2 to one another in a row connection or a parallel connection.

In order to connect the entire high-voltage energy storage module 1 to a further high-voltage energy storage module 1 or to the high-voltage power supply of a vehicle, a cable 9 is provided. In order to connect this cable 9 to the circuit board 3, a metal element 8 is located on the circuit board 3. On the metal element 8, a connection device 10 is formed, for example for the screwing on of a cable lug of the cable 9. The metal element 8 is connected to one of the poles 4 by way of a connection 7.

Figure 3:
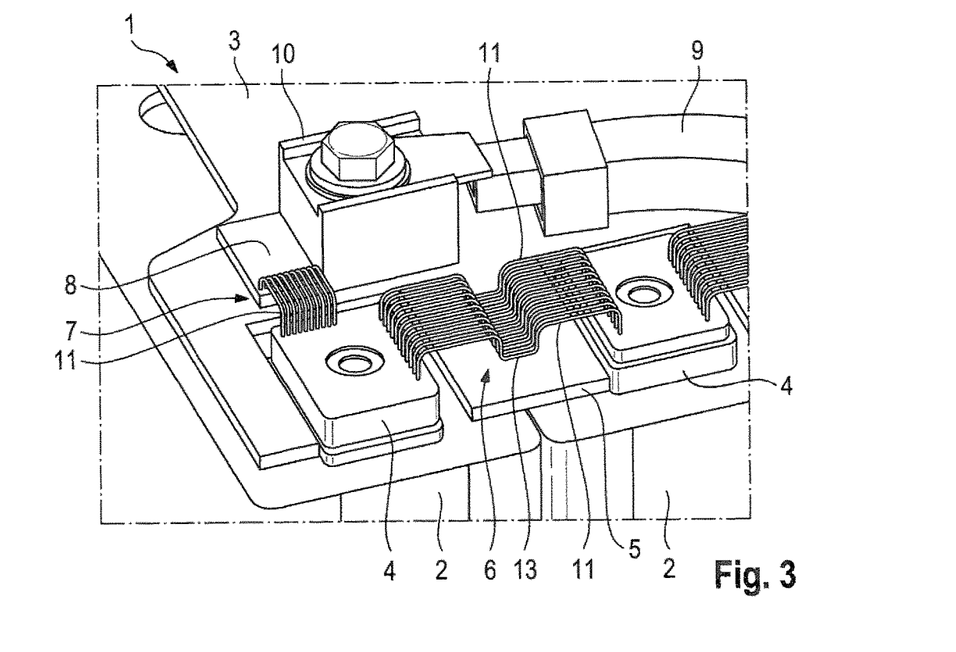
FIG. 3 is a perspective view of a first detail of the high-voltage energy storage module according to invention in accordance with the first exemplary embodiment.

FIG. 3 shows a first detail from FIG. 1. The connection 6 is composed of a plurality of bonding wires 11 arranged one next to the other. The bonding wires 11 are arranged, in particular, in parallel with one another and are spaced apart from one another. The bonding wires 11 can also be arranged one on top of the other. Each bonding wire leads from one pole 4 via the circuit board 3 to the adjacent pole 4. Each bonding wire 11 is attached to both poles 4 and to the circuit board 3, and placed in contact therewith, by use of wire bonding. In the example shown, eleven bonding wires 11 are selected for the connection 6. The number of bonding wires 11 is selected in accordance with the cross section of the individual bonding wires 11 and the maximum current.

Furthermore, FIG. 3 shows the connection 7. The connection 7 also consists of individual bonding wires 11. The bonding wires 11 are arranged one next to the other, in particular parallel to one another. Each bonding wire is connected to the metal element 8 and the pole 4 by use of wire bonding.

Figure 4:
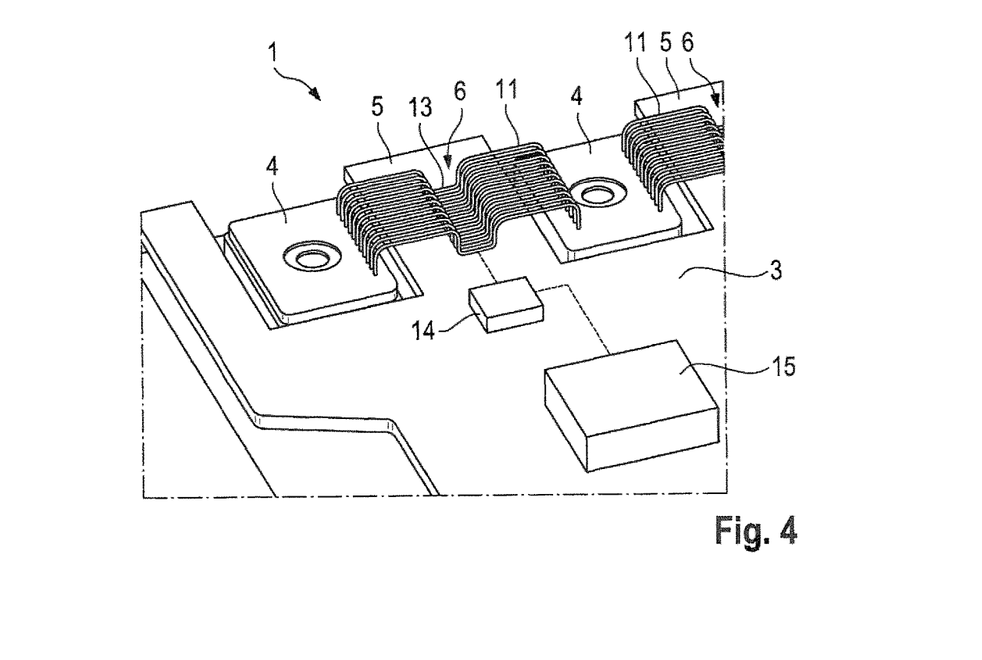
FIG. 4 is a perspective view of a second detail of the high-voltage energy storage module according to invention in accordance with the first exemplary embodiment.

FIG. 4 shows a second detail from FIG. 1. The point at which the individual bonding wires 11 of the connection 6 are connected to the circuit board 3 is referred to as the attachment point 13. In the vicinity of this attachment point 13 there is a temperature sensor 14 on the circuit board 3. The bonding wires 11 conduct the temperature of the pole 4, and therefore of the storage cell 2, to the circuit board 3. On the circuit board 3, a corresponding temperature can be detected with the temperature sensor 14. Any phase shifts or temperature losses between the temperature sensor 14 and the storage cell 2 are compensated by a corresponding calculation model. For this purpose, the temperature sensor 14 is connected to a CPU 15 on the circuit board 3. The CPU 15 and the temperature sensor 14 are generally electronics by which the individual storage cells 2 can be monitored. For example, the cell voltage in the individual cell 2 can also be measured with the CPU 15 via the attachment point 13.

FIGS. 5 and 6 show a second exemplary embodiment of the high-voltage energy storage module 1. In contrast to the first exemplary embodiment, in the second exemplary embodiment there is provision that the bonding wires 11 of the connection 6 run directly from one pole 4 to the adjacent pole 4. In this context, the attachment point 13 between the two poles 4 is eliminated. As a result, the poles 4 can be located closer to one another. An additional bonding wire 12, which is attached by one end to the pole 4 and by the other end to the circuit board 3, is provided on each storage cell 2 for the measurement current. The attachment of the additional bonding wire 12 is in turn carried out by way of wire bonding. In particular, at least one additional bonding wire 12 is used per storage cell 2 or per pole 4. The connecting point of the additional bonding wire 12 on the circuit board 3 again forms an attachment point 13 via which, for example, the temperature and/or the cell voltage can be measured.

FIG. 7 shows steps S1 to S4 for producing the high-voltage energy storage modules 1 of both exemplary embodiments. For example, the wire bonding of the bonding wires 11 between two adjacent poles 4 is shown.

FIG. 7 shows in step S1 that the bonding wire 11 is guided through a capillary or feed device 16. The end of the bonding wire 11 is firstly positioned on a pole 4. According to S2, an ultrasonic vibration 18 is then applied to the bonding wire 11 and/or to the capillary 16. At the same time, a bonding force 17 is applied, with the result that the bonding wire 11 is connected to the pole 4. After this, the capillary 16 is guided to the adjacent pole 4 according to step S3. Through the movement of the capillary 16, the bonding wire 11 is simultaneously bent into the correct shape. According to step S3, the bonding force 17 and the ultrasonic vibration 18 are in turn applied, with the result that the bonding wire 11 is also connected to the next pole 4. According to step S4, a corresponding movement of the capillaries 16 finally takes place with the result that the bonding wire 11 is disconnected.

In the embodiment of the connection 6 in accordance with the first exemplary embodiment, the capillary 16 is positioned with the bonding wire 11 between the steps S2 and S3 on the circuit board 3. In this context, the ultrasonic vibration 18 and the bonding force 17 are also applied to the circuit board 3. However, the bonding wire 17 is preferably not cut off directly after the connection to the circuit board 3 but instead the connection between the bonding wire 11 and the next pole 4 takes place in accordance with step S4. As a result, in the first exemplary embodiment a continuous bonding wire 11 leads from one pole 4 via the circuit board 3 to the next pole 4. The circuit board 3 therefore does not have to conduct the main current, for example at a level of 200 A.

LIST OF REFERENCE NUMERALS

1 High-voltage energy storage module
2 Storage cells
3 Circuit board
4 Poles
5 Clips
6 Connections
7 Connection
8 Metal element
9 Cable
10 Connecting device
11 Bonding wires
12 Additional bonding wires
13 Attachment point
14 Temperature sensor
15 CPU
16 Capillary
17 Bonding force
18 Ultrasound The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A high-voltage energy storage module for supplying voltage, comprising:
    at least two storage cells; and
    at least one electrically conductive connection between two poles of different storage cells, wherein
    the at least one electrically conductive connection comprises a plurality of bonding wires arranged one next to the other, each bonding wire being attached to the two poles via wire bonding.

2. The high-voltage energy storage module according to claim 1, further comprising:
    a circuit board arranged on the at least two storage cells, the circuit board comprising electronics designed to monitor the storage cells.

3. The high-voltage energy storage module according to claim 2, wherein
    at least one of the plurality of bonding wires is attached on the circuit board via wire bonding between the two poles of the different storage cells.

4. The high-voltage energy storage module according to claim 2, further comprising:
    at least one additional bonding wire connecting one of the two poles to the circuit board, the at least one additional bonding wire being attached to the one of the two poles and to the circuit board via wire bonding at respective ends thereof.

5. The high-voltage energy storage module according to claim 3, further comprising:
    at least one additional bonding wire connecting one of the two poles to the circuit board, the at least one additional bonding wire being attached to the one of the two poles and to the circuit board via wire bonding at respective ends thereof.

6. The high-voltage energy storage module according to claim 3, further comprising:
    a temperature sensor as at least part of the electronics, the temperature sensor being arranged on the circuit board at an attachment point of the bonding wire to the circuit board, wherein
    the temperature sensor is designed to determine a temperature of the storage cell passed on via the bonding wire.

7. The high-voltage energy storage module according to claim 4, further comprising:
    a temperature sensor as at least part of the electronics, the temperature sensor being arranged on the circuit board at an attachment point of the additional bonding wire to the circuit board, wherein the temperature sensor is designed to determine a temperature of the storage cell passed on via the additional bonding wire.

8. The high-voltage energy storage module according to claim 2, wherein all poles of the at least two storage cells are oriented on one side of the high-voltage energy storage module, and the circuit board is configured to rest on said one side.

9. The high-voltage energy storage module according to claim 2, further comprising:

a metal element arranged on the circuit board and having a connecting device for a cable; and an electrically conductive connection extending between one pole of a respective storage cell and the metal element, wherein the electrically conductive connection comprises a plurality of bonding wires arranged one next to the other, each bonding wire being attached to the one pole and to the metal element via wire bonding.

10. The high-voltage energy storage module according to claim 9, wherein the metal element is an aluminum panel.

11. The high-voltage energy storage module according to claim 6, further comprising:

a metal element arranged on the circuit board and having a connecting device for a cable; and an electrically conductive connection extending between one pole of a respective storage cell and the metal element, wherein the electrically conductive connection comprises a plurality of bonding wires arranged one next to the other, each bonding wire being attached to the one pole and to the metal element via wire bonding.

12. The high-voltage energy storage module according to claim 1, wherein the plurality of bonding wires each have a round cross-section with a maximum diameter of one millimeter.

13. The high-voltage energy storage module according to claim 1, wherein the plurality of bonding wires each have a round cross-section with a maximum diameter of 500 μm.

14. The high-voltage energy storage module according to claim 1, wherein the plurality of bonding wires, in aggregate, are ribbon-shaped and have a maximum width of 3 millimeters.

15. The high-voltage energy storage module according to claim 1, wherein the plurality of bonding wires, in aggregate, are ribbon-shaped and have a maximum width of 2 millimeters.

16. The high-voltage energy storage module according to claim 1, wherein the energy storage module is configured for a motor vehicle.

17. A method for producing a high-voltage energy storage module for supplying voltage in a motor vehicle, the method comprising the acts of:

providing at least two storage cells; and forming at least one electrically conductive connection between two poles of different ones of the at least two storage cells, wherein the act of forming the at least electrically conductive connection is carried out by wire-bonding a plurality of bonding wires to both of the two poles to form an individual connection.

18. The method according to claim 17, wherein the wire bonding is carried out by applying one of pressure, ultrasound or an increased temperature.

19. The method according to claim 17, further comprising the act of:

wire-bonding at least one of the plurality of bonding wires to a circuit board of the high-voltage energy storage module at a location between ends of the at least one bonding wire that are wire bonded to the poles of the different storage cells.

20. The method according to claim 17, further comprising the act of:

wire-bonding an additional bonding wire at one end to one pole of a respective storage cell and at another end to a circuit board of the high-voltage energy storage module.

* * * * *